PRODUCTION OF P.N. JUNCTIONS IN SEMICONDUCTOR MATERIAL

Filed May 12, 1960 2 Sheets-Sheet 1

INVENTORS
Robert Lindsay Rouse
James Wakefield
Ronald Charles Newman

INVENTORS
Robert Lindsay Rouse
James Wakefield
Ronald Charles Newman
BY
Lawson and Taylor

1

3,128,530

PRODUCTION OF P.N. JUNCTIONS IN SEMICONDUCTOR MATERIAL

Robert Lindsay Rouse, Caversham, Reading, James Wakefield, Beenham, near Reading, and Ronald Charles Newman, Earley, Reading, England, assignors to Associated Electrical Industries Limited, London, England, a British company Filed May 12, 1960, Ser. No. 28,644
Claims priority, application Great Britain May 21, 1959
4 Claims. (Cl. 29—25.3)

This invention relates to the production of p.n. junctions in semi-conductor material and to the utilisation of such junctions.

In the specification accompanying prior U.S. application Serial No. 15,934, filed on March 18, 1960, by Ronald Bullough, Ronald Charles Newman, James Wakefield, Robert Lindsay Rouse and John Bernard Willis, and assigned to the assignee of the present application, a method of making diode and transistor structures by the formation of cylindrical p.n. junctions round single dislocations in a semiconductor initially containing both donor and acceptor impurities is described. Essentially, the impurity which is present in the higher concentration is caused preferentially to diffuse to, and precipitate at, the dislocations and hence produce a change of conductivity type in a cylindrical region immediately surrounding the dislocation; this diffusion and precipitation is effected by an approprate controlled heat-treatment process. The region containing the dislocation is then isolated and contacts made to the p- and n-regions.

According to the invention, a p.n. junction device is produced by heating a crystal body of semiconductor material containing impurity activators of opposite conductivity types and characterised by a crystal structure possessing an internal crystals boundary forming an array of dislocations substantially regularly spaced from one another, the heating being such as to produce controlled diffusion and precipitation at the crystal boundary of one or more of the activators whereby to obtain an array of spaced regions of opposite conductivity type from that of the remainder of the body, and attaching ohmic contacts to the array and to spaced regions of the body on opposite sides of the array.

By this means there is produced a transistor analogous in operation to a triode valve, the array of regions of opposite conductivity type to the remainder of the body being equivalent to the grid of the triode and capable of controlling the current flow between the ohmic contacts at the regions of the body located on opposite sides of the array.

The operation of this type of transistor has been described by W. Shockley, U.S. Patent No. 2,790,037. It is a basic requirement of the device that the body of the semiconductor material surrounding the array of cylindrical regions should have a fairly small net concentration of impurity activators, whereas the cylindrical cores should contain a fairly high concentration of impurity activators.

The crystal structure possessing the required internal crystal boundary may be produced by seed crystal withdrawal from a melt of pure semiconductor material containing the required proportions of the opposite types of impurity activator the seed crystal having the required internal crystal boundary which is communicated to the ingot produced by seed crystal withdrawal.

2

The crystal boundary with which the invention is concerned is a pure tilt boundary which can be defined as the boundary between two crystals which are each rotated by an angle of $\theta/2$ radians away from a common axis within the tilt boundary, the angle of misfit between the two crystals being $\theta$. Such a tilt boundary consists, for small angles of $\theta$, of parallel lines of misfit separated by a definite distance (depending on $\theta$); the two crystals between the lines of misfit form regions of good fit. If the angle of tilt is less than 5°, these lines of misfit can be identified as the regions beneath the individual edge dislocations which comprises the boundary. The spacing $h$ between dislocations in a small angle tilt boundary is given by $h \approx a/\theta$, where $a$ is the lattice constant in centimetres and $\theta$ is the angle of misfit in radians.

In the same manner as that described in the above mentioned specification, when a body of semi-conductor material containing both p-type and n-type activator impurities in uniform concentrations and characterised by a crystal structure having a tilt boundary is suitably heated a cylindrical p.n. junction will be formed round each dislocation comprising the tilt boundary. Providing the spacing between the dislocations is sufficiently large, the p.n. junctions round each dislocation will not overlap. In this way, a row of discrete cylindrical p.n. junctions can be formed. The spacing between dislocations can be controlled by controlling the angle of tilt between the two crystals. For example, for a spacing $10^{-3}$ cm. between dislocations, the angle of tilt is approximately 6 seconds of arc. Such a tilt boundary can be introduced into the semiconductor crystal by growing from a melt using a suitable seed.

The seed crystal is either a crystal already containing a tilt boundary (bi-crystal seed) or consists of two identical crystals which are rotated with respect to each other by the required angle. The boundary is propagated down the growing crystal which then becomes a bi-crystal.

The melt from which the body having the required crystal structure is grown contains impurity activators in appropriate concentration. When using silicon as the semiconductor material aluminium may be used as the p-type activator impurity and phosphorus as the n-type activator impurity. The aluminium is present in the melt slightly in excess of phosphorus so that the body is initially of p-type conductivity. For diffusion of impurities to occur, the body of silicon obtained from the grown crystal is heated at a temperature of about 1150–1250° C., either in vacuo or in an inert gas atmosphere. Typically, the silicon specimens may be sealed into a quartz container which is evacuated or which contains an inert gas, the whole container then being heated in a resistance furnace.

In the manner described in the above specification aluminium combines with oxygen at crystal boundaries to form a stable complex. The crystal boundary consists of regularly spaced dislocations, and in these regions a second phase, such as an aluminium-oxygen complex, forms. There will thus be a series of cylindrical n-type regions form round each dislocation of the boundary.

The invention will now be described with the aid of the accompanying drawings, in which.

Figure 3:
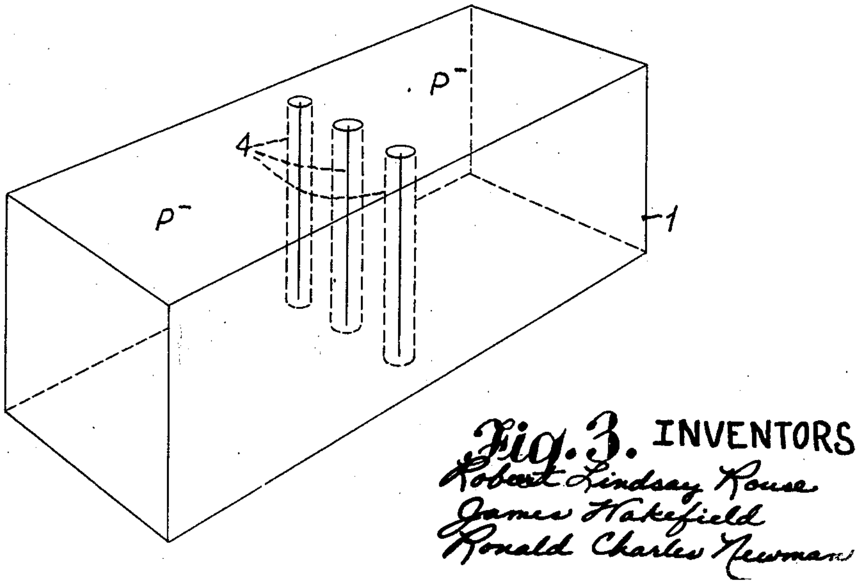
Figure 4:
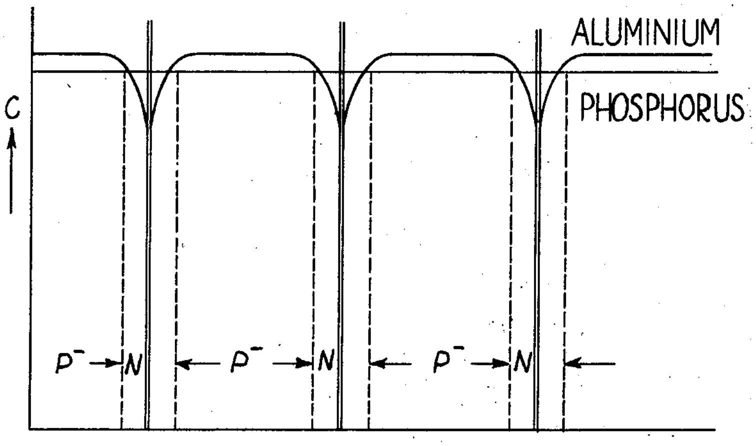
Figure 5:
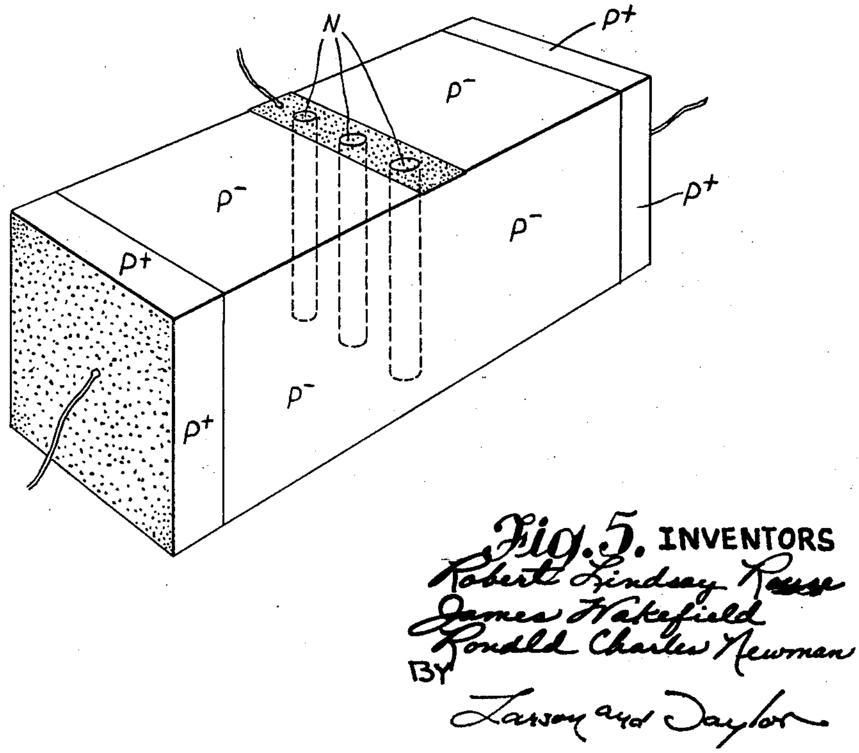

FIG. 3 indicates the formation of the array of p.n. junctions at the crystal boundary after heating;

FIG. 4 illustrates the concentration of the impurity activators as affected by the heating; and FIG. 5 shows a semi-conductor device produced by the invention.

Figures 1, 2:
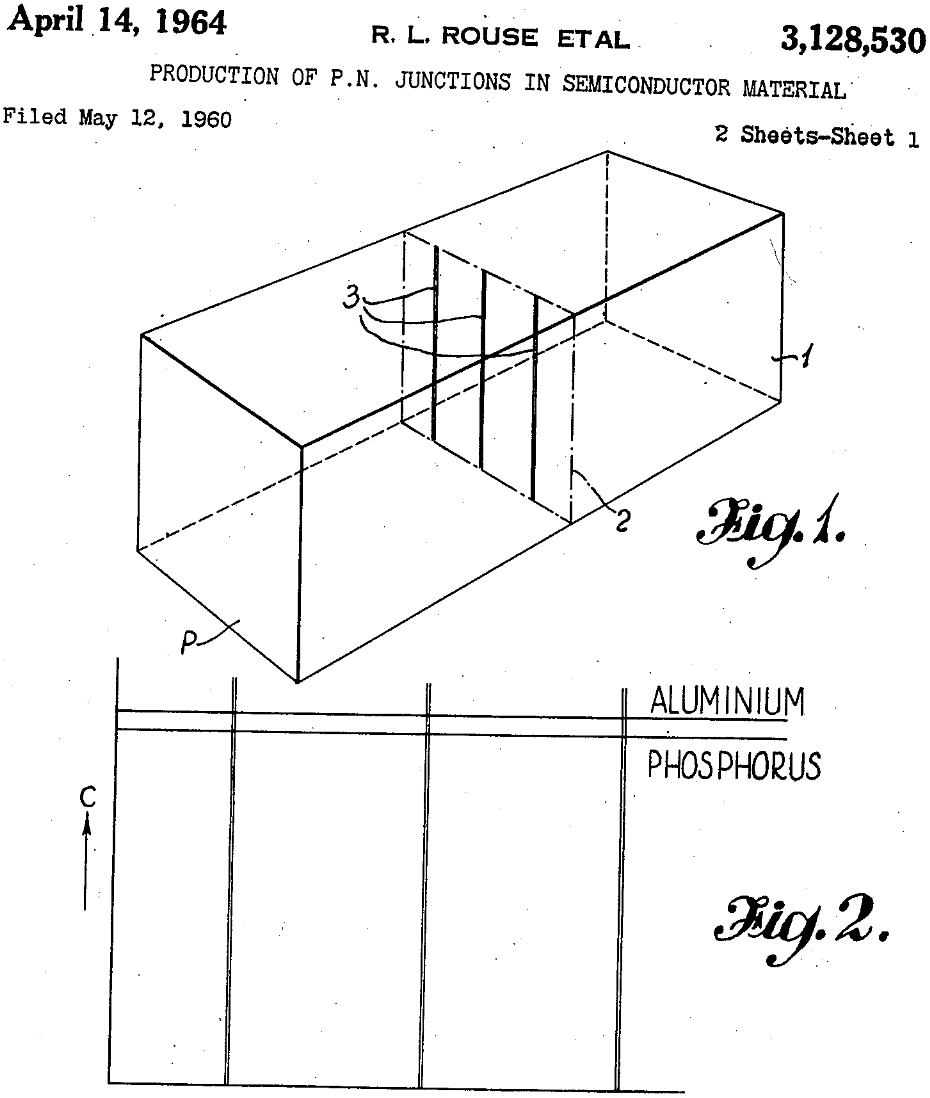
FIG. 1 illustrates a body of semi-conductor material containing a planar crystal boundary at which a p.n. junction structure is to be formed.
FIG. 2 represents the concentrations of the impurity activators at the boundary prior to the heat treatment.

Referring to FIGS. 1 and 2, a semi-conductor body 1 of mono-crystal formation contains a low angle tilt boundary 2 having dislocation lines 3. The body 1 is obtained, as above described, from an ingot produced by seed crystal withdrawal from a melt of semi-conductor material containing p-type an n-type activators in uniform concentration, the p-type activator being in excess so as to render the body initially of p-type material. Assuming the body to be of silicon and to contain aluminium and phosphorus as the activators, the relative concentrations of the activators at the dislocations is as indicated in FIG. 2, concentrations being shown on the vertical axis against positive in the horizontal axis.

The body is heated to a temperature close to the melting point of the body material either in vacuo or in an inert atmosphere. For silicon, the heating may be carried to a temperature of about 1250° C. During the heating diffusion to, and precipitation at, the dislocations of the impurity activator takes place with the result that tubes 4 of n-type material are formed therearound, as shown in FIG. 3. The concentrations of aluminium and phosphorus, after heating, are then as indicated in FIG. 4. The p-type concentration is considerably reduced at the disclocations, and a cylindrical p.n. junction is formed some distance away where the concentrations of the p-type and n-type impurities are equal.

For any particular boundary, the radius of the n-type tubes or cores can be controlled by varying (1) the temperature at which heat treatment is carried out, (2) the duration of the heat treatment, and (3) the relative levels of the n-type and p-type impurities in the silicon. The n-type region is arranged to be more heavily doped than the p-type body.

After the formation of the required n-type grid structure, the appropriate region containing this structure is then taken from the semi-conductor body, for example by cutting or grinding, and electrical contacts made to the various regions. If desired, a suitable etching or cleaning treatment can be given subsequent to this cutting or grinding.

Ohmic contact is made to the array of n-type regions 4 by means of a metal layer 5 located at the surface of the body 1. Ohmic contact is similarly made to the p-type regions on either side of the array as shown at 6. Leads are secured to the contacts 5, 6 in any suitable manner.

By control of the potential applied to contact 5, the current flow between contacts 6 is controllable.

The dislocations are located on the surface of this wafer by an etching procedure. A suitable etch for this purpose consists, for example, of a mixture of hydrofluoric acid, nitric acid and acetic acid in the proportions 1 HF, 3 $HNO_3$, 10 $CH_3COOH$. This etch leads to the formation of an etch pit where the dislocation intersects the surface.

After heat treatment, a thin surface layer is removed by grinding or other means. This removes the n-type surface skin which is formed on heat treatment, as hereinbefore described. The p.n. junction profile can then be delineated on the surface of the crystal by etching, for example, in a mixture of 50% hydrofluoric acid, 50% nitric acid, or, alternatively, in the etch described above.

In these etches, the n-type crystal is removed at a faster rate than the p-type crystal, thus producing a step on the surface at the p.n. junction, and also forming an etch pit at the point of emergence of the dislocation. The path of the dislocation inside the crystal can be followed by means of infra-red transmission microscopy, using infra-red radiation of wavelength greater than that corresponding to the absorption edge (i.e. a wavelength greater than $1.1. < 10^{-4}$ cm.).

Contacts may be applied to the p- and n-regions by techniques which are well known in semiconductor technology. For instance, a gold wire containing a small trace of antimony (an n-type material) may be alloyed to the n-type core and aluminium may be alloyed to the p-type material.

What we claim is:

1. The process of producing a p.n. junction device which consists in heating a crystal body of semi-conductor material containing oxygen together with impurity activators of opposite conductivity types in homogeneous concentration said activator concentration of one conductivity type being initially predominant, said body being characterised by a crystal structure possessing an internal crystal boundary forming an array of dislocations substantially regularly spaced from one another, the heating being such as to produce controlled diffusion to and precipitation with said oxygen at the crystal boundary of at least one of said initially predominant activators to obtain an array of spaced regions of opposite conductivity type from that of the remainder of the body, and attaching ohmic contacts to the array and to spaced regions of the body on opposite sides of the array.

2. The process of producing a p.n. junction device of the transistor type which consists in heating to a temperature of between 1150° C. and 1250° C. a body of p-type crystal silicon containing dissolved oxygen together with aluminium and phosphorus homogeneously as impurity activators, said aluminium being initially in predominance, said body and possessing an internal crystal boundary forming an array of dislocations substantially regularly spaced from one another, so as to produce controlled diffusion to and precipitation with said oxygen at said boundary of said aluminium activator, whereby to deplete the region in the immediate neighbourhood of said boundary of aluminium and form an n-type region adjacent said boundary, and attaching ohmic contacts to the array and to spaced regions of the body on opposite sides of the array.

3. The process of producing a p.n. junction in a body of crystal silicon which consists in preparing an ingot of crystal silicon by seed crystal withdrawal from a melt of purified silicon containing oxygen together with uniform impurity activator concentrations of aluminum and phosphorus with aluminium in excess, the seed crystal containing a tilt boundary which is reproduced in the ingot, heating to a temperature of between 1000 and 1250° C. a body of bi-crystal silicon obtained from the ingot whereby to cause the depletion of the aluminium in the region in the immediate neighbourhood of the crystal boundary by combination with said oxygen and thereby to form an adjacent region of opposite conductivity type to that of the body.

4. The process of producing a transistor having a p.n. junction of extended area in a body of silicon which consists in preparing an ingot of bi-crystal silicon containing dissolved oxygen by seed crystal withdrawal from a melt of purified silicon containing uniform impurity activator concentrations of aluminium and phosphorus with aluminium in excess, the seed crystal consisting of two identical crystals rotated with respect to one another to produce a crystal boundary which is reproduced in the ingot, heating to a temperature of between 1000 and 1250° C. a body of bi-crystal silicon obtained from the ingot whereby to cause the combination of aluminium with oxygen in the region in the immediate neighbourhood of the boundary with resulting depletion of aluminium in that region and thereby to cause said region to be of opposite conductivity type to that of the body and attaching ohmic contacts to the n-type region adjacent the boundary and to the body on opposite sides of the boundary.

References Cited in the file of this patent

UNITED STATES PATENTS

| | | |
|---|---|---|
| 2,937,114 | Shockley | May 17, 1960 |
| 2,954,307 | Shockley | Sept. 27, 1960 |
| 2,979,427 | Shockley | Apr. 11, 1961 |

OTHER REFERENCES

Journal of Applied Physics, volume 29, 1958, relied on pages 736 and 737.

Karstensen: Journal of Electronics & Control, volume 3, July-December, 1957, pages 305–307 relied on.

Bilby: Journal of the Physical Society of Japan, volume 10, No. 8, August 1955, pages 673–679 relied on.

Ellis: Journal of Applied Physics, volume 26, No. 9, September 1955, pages 1140–1146 relied on.